United States Patent [19]

Yoshida et al.

[11] Patent Number: 4,755,968

[45] Date of Patent: Jul. 5, 1988

[54] BUFFER MEMORY DEVICE CONTROLLED BY A LEAST RECENTLY USED METHOD

[75] Inventors: Toyohiko Yoshida; Yoshihiro Seguchi, both of Itami, Japan

[73] Assignee: Mitsubishi Denki Kabushiki, Tokyo, Japan

[21] Appl. No.: 875,447

[22] Filed: Jun. 17, 1986

[30] Foreign Application Priority Data

Jun. 18, 1985 [JP] Japan ................................. 60-132709

[51] Int. Cl.$^4$ ............................................ G11C 13/00
[52] U.S. Cl. ................................................... 365/189
[58] Field of Search ................. 365/238, 239, 240, 78, 365/189, 49

[56] References Cited

U.S. PATENT DOCUMENTS

| | | | |
|---|---|---|---|
| 3,827,028 | 7/1974 | Kashio | 365/239 |
| 3,896,417 | 7/1975 | Beecham | 365/78 |
| 3,942,163 | 3/1976 | Goyal | 365/78 |
| 4,346,459 | 8/1982 | Sud et al. | 365/200 |
| 4,388,701 | 6/1983 | Aichelmann, Jr. et al. | 365/238 |

OTHER PUBLICATIONS

"Computer Architecture", by Hiroshi Yamada, pp. 123 to 131, Sangyo Tosho Publishing Ltd.

"Basic Integrated Circuit Engineering", by D. J. Hamilton and W. G. Howard, pp. 566 to 567, McGraw-Hill.

*Primary Examiner*—Terrell W. Fears
*Assistant Examiner*—Melissa J. Koval
*Attorney, Agent, or Firm*—Birch, Stewart, Kolasch & Birch

[57] ABSTRACT

A buffer memory device is formed of: a plurality of memory blocks each comprising a register and a comparator for comparing the content of said register and the input data. A control circuit controls the shift of the data of said registers in such a manner that only the contents of said registers from the first memory block to a desired memory block are shifted.

3 Claims, 2 Drawing Sheets

BUFFER MEMORY DEVICE CONTROLLED BY A LEAST RECENTLY USED METHOD

FIELD OF THE INVENTION

The present invention relates to a buffer memory device, and more particularly to that in which the register is of FIG. 3 operates a shift register.

BACKGROUND OF THE INVENTION

A prior art buffer memory device is shown in FIG. 3. In FIG. 3, the reference numeral 30a designates a comparator, the numeral 30b designates a latch, and the numeral 25 designates a memory circuit for storing the order of the use of the latch 30b. Each memory block 30 of the buffer memory device is constituted by the latch 30b and the comparator 30a.

The device as follows.

When input data is input to this circuit a coincidence signal $a_1$ to $a_n$ indicative of the fact that the content of the latch 30b and the input data coincide with each other is output from the comparator 30a associated with the latch 30b which stores the same data as the input data. When no latch 30b stores the content in coincidence with the input data, no coincidence signal $a_1$ to $a_n$ is output from the comparator 30a. When the input data and the content of the latch 30b of any memory block 30 do not coincide with each other as described above, the input data must be stored in a buffer memory device. In this case, the new data is written in into a block 30 which is selected for storing the input data among the blocks of the buffer memory device. As a method of selecting the memory block 30, there is a LRU (Least Recently Used) method which selects the least recently used memory block, and this method increases the efficiency of the buffer memory device. In order to execute this LRU method the buffer memory device is required to have a memory circuit 25 for storing the order of the use of the memory block 30. Assuming that the number of memory blocks 30 is n, the memory circuit 25 has to be capable of storing n! states.

In the prior art buffer memory device with such a construction it is necessary to provide a use order memory circuit 25 capable of storing n! states in replacing of the data in accordance with the LRU method. This results in an increase in the circuit size.

Regarding another prior art buffer memory device there is an article, "Basic Integrated Circuit Engineering", by D. J. HAMILTON and W. G. HOWARD, pp. 566–567, McGRAW-HILL Co., Ltd. In a usual shift register shown in FIG. 15-11 of this article, the contents stored in the respective flip-flops are all shifted to the next stages. A control circuit is not provided for controlling to shift the content of a desired flip-flop to the next stage.

Another prior art buffer memory device is disclosed in an article, "Computer Architecture", by Hiroshi Yamada, pp. 123–131, published by Sangyo Tosho Syuppan Co., Ltd. In this article it can be seen that a circuit for storing the order of the use is required for enabling selecting of the block which has not been used for the longest time.

SUMMARY OF THE INVENTION

An object of the present invention is to provide an improved buffer memory device capable of conducting a displacement of data with the use of the LRU method without an increase in the memory size.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a buffer memory device comprising: a plurality of memory blocks each comprising a register and a comparator for comparing the content of said register and the input data; and a control circuit for controlling the shift of the data of said registers in such a manner that only the contents of said registers from the first memory block to a desired memory block are shifted.

DETAILED DESCRIPTION OF THE PREFERRED EMBODIMENTS

Figure 1:
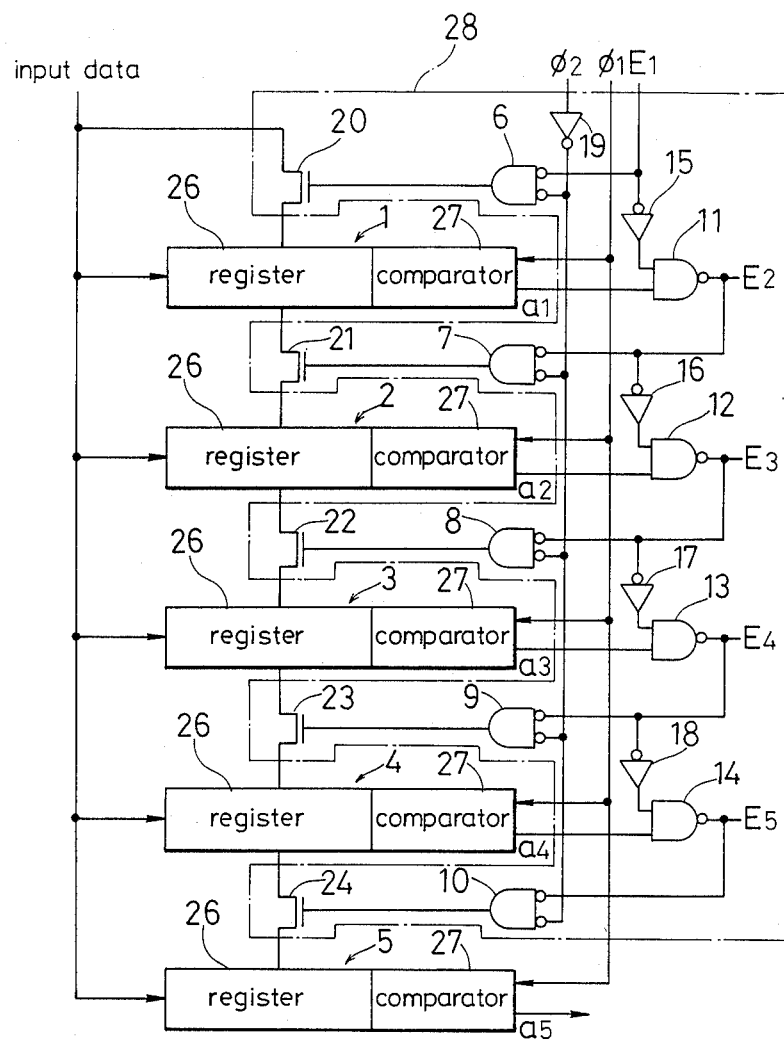
FIG. 1 is a diagram showing a buffer memory device as an embodiment of the present invention.
Figure 2:
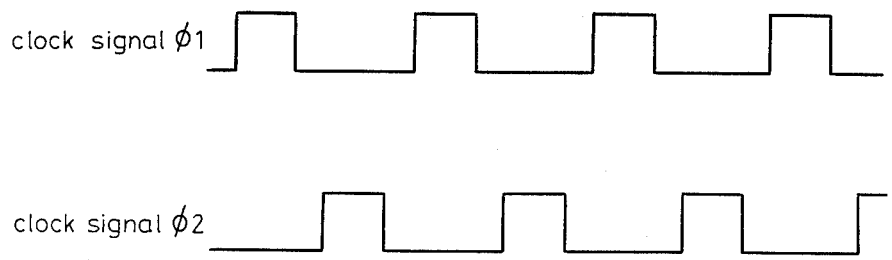
FIG. 2 is a timing chart showing the clock signals $\phi 1$ and $\phi 2$.
Figure 3:
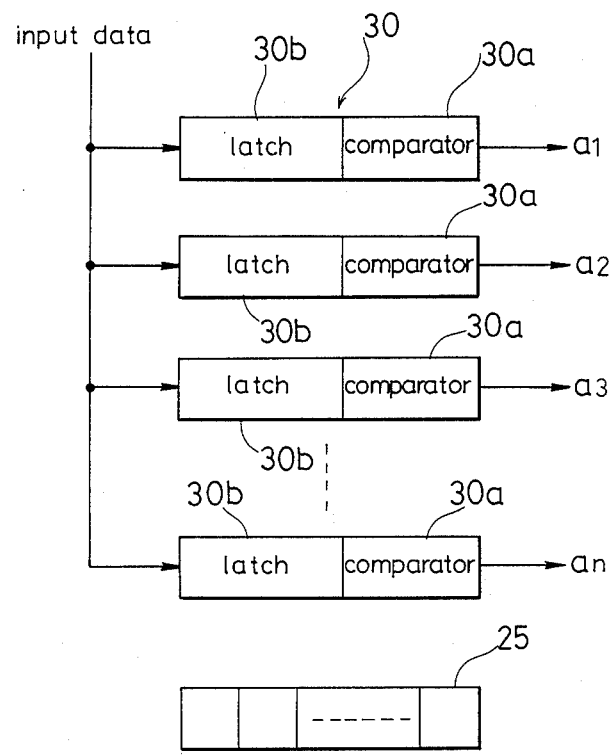
FIG. 3 is a diagram showing a prior art buffer memory device.

In order to explain the present invention in detail, reference will be particularly made to FIGS. 1 and 2.

In FIG. 1 the reference numerals 1 to 5 designate memory blocks, the numerals 6 to 10 designate NOR circuits, the numerals 11 to 14 designate NAND circuits, the numerals 15 to 19 designate inverters, the numerals 20 to 24 designate transmission gates, the reference characters $a_1$ to $a_5$ designate coincidence signals, and the reference characters E1 to E5 designate shift enable signals. Each memory block 1 to 5 is formed of a register 26 and a comparator 27. The NOR circuits 6 to 10, the NAND circuits 11 to 14, the inverters 15 to 19, and the transmission gates 20 to 24 constitute a control circuit, generally indicated as 28, for controlling the shift operations of the registers 26.

Each NMOS transistor 20 to 24 which functions as a transmission gate is connected between the input terminal and the register 26 or between two registers 26. The output of the respective NOR circuit 6 to 10 is connected to the gate electrode of the respective transistor 20 to 24, and the respective shift enable signal E1 to E5 for instructing to conduct a shift or not and a clock signal $\phi 2$ are input to the respective NOR circuit 6 to 10. The respective comparator 27 of the respective memory block 1 to 5 compares the input data and the data stored in the register 26 of that memory block when the clock signal $\phi 1$ is "1" thereby to output the coincidence signal $a_1$ to $a_5$. The respective coincidence signal $a_1$ to $a_5$ becomes "0" when the input data and the content of the register 26 coincide with each other, and becomes "1" otherwise.

FIG. 2 shows waveforms of the two clock signals $\phi 1$ and $\phi 2$. These clock signals $\phi 1$ and $\phi 2$ have phases opposite to each other, and do not become "1" at the same time.

The device will be operated as follows.

First of all, when the clock signal $\phi 1$ is "1" the comparator 27 of each memory block 1 to 5 compares the input data and the content of the register 26, and outputs the coincidence signal $a_1$ to $a_5$ as the result of comparison. For example, when the content of the register 26 of the memory block 3 and the input data coincide with each other, the coincidence signal $a_3$ from the comparator 27 of the memory block 3 is "0", and the coincidence signals $a_1$, $a_2$, $a_4$, and $a_5$ from the other memory blocks 1, 2, 4, and 5 are all "1". When the shift enable signal E1 is made "0", the shift enable signal E2 output from the NAND circuit 11 becomes "0", and the shift enable signal E3 also becomes "0". The shift enable signal E4 is "1" because the coincidence signal $a_3$ is "0", and the shift enable signal E5 is also "1". The shift enable signals E1 to E3 become "0" and the other shift enable signals E4 and E5 become "1" when the data of the memory block 3 and the input data coincide with each other as described above. Then, the clock signal $\phi 2$ is "0", and the outputs of the NOR circuits 6 to 10 are all "0", and the transmission gates 20 to 24 are all OFF, and all the paths between the memory blocks 1 to 5 are in high-impedance states, thereby disabling the shift of the data.

Next, when the clock signal $\phi 1$ becomes "0" and the clock signal $\phi 2$ becomes "1", the outputs of the NOR circuits 6, 7, and 8 become "1", and the outputs of the NOR circuits 9 and 10 become "0" because the shift enable signals E1, E2, and E3 were "0" and the shift enable signals E4 and E5 were "1". Thus, the transmission gates 20, 21, and 22 are turned ON, and the transmission gates 23 and 24 are kept OFF. As a result, the input data is shifted to the register 26 of the memory block 1, and the data stored in the register 26 of the memory block 1 is shifted to the register 26 of the memory block 2, and the data of the memory block 2 is shifted to the memory block 3. The data of the registers 26 of the memory blocks 3 and 4 will not be shifted to the next stages because the transmission gates 23 and 24 are OFF, and the contents of the registers 26 of the memory blocks 4 and 5 are unchanged.

The above described operation is performed in a case where the input data and at least one of the data of the memory blocks coincide with each other. If the data stored in any of the memory blocks 1 to 5 does not coincide with the input data, the coincidence signals $a_1$ to $a_5$ will become all "1", and the shift enable signals E1 to E5 will become all "0". As a result, the transmission gates 20 to 24 are all turned ON when the clock signal $\phi 2$ is "1". Thus, the contents of the memory blocks 1 to 4 are shifted to the next stage memory blocks 2 to 5, the content of the memory block 5 is banished, and the input data is stored in the memory block 1.

As described above the most recently used data is always stored in the memory block 1, and the data used subsequently thereto are stored in the subsequent memory blocks 2, . . . in the order of the use, and the least recently used data is stored in the memory block 5. When data other than that stored in the memory blocks is used, the data of the registers of all the memory blocks are shifted to the next stages, and the least recently used data stored in the memory block 5 is banished. A buffer memory device realizing the displacement of data with the use of the LRU method is constructed in this way.

In the above illustrated embodiment, there are provided five memory blocks, but the number of the memory blocks can be any integer n with the same effects as described above.

As is evident from the foregoing description, according to the present invention, the memory section of the memory block is constituted by a shift register, and a control circuit for controlling the shift of the data in such a manner that the data of several blocks from the first block to a desired number block are shifted to the next stages, thereby realizing the data displacement with the use of the LRU method with no increase in the circuit size.

What is claimed is:

1. A buffer memory device comprising:
    a plurality of memory blocks each including a register and a comparator for comparing the content of said register and the input data and developing a coincidence signal upon the coincidence thereof; and
    a control circuit responsive to said coincidence signal for controlling the shift of the data within said registers in such a manner that, when a coincidence signal is developed by a comparator of a selective memory block, only the contents of said registers between the first memory block and the selected memory block are shifted, said control circuit comprising;
        a plurality of transfer gates, a transfer gate being provided between a data input terminal and said register of said first memory block, for shifting said input data to said first memory block, a transfer gate being provided between each two said adjacent memory blocks for shifting said data between said adjacent registers,
        a plurality of NOR circuits, a NOR circuit being provided in correspondence with each of said memory blocks for turning ON or OFF said transfer gates, and
        a plurality of NAND circuits, each said NAND circuit being in correspondence with one of said memory blocks for generating a signal for controlling each of said corresponding NOR circuits in response to the said coincidence signal developed by said one of said memory blocks.

2. The device of claim 1 wherein a first one of said plurality of memory blocks receives said input data; said control circuit shifting said data within said registers toward and out of a last one of said memory blocks to retain all but the oldest data in said plurality of memory blocks.

3. The buffer memory device of claim 1 wherein said control circuit means is responsive to first and second clock pulse signals, said first and second clock pulse signals being phase shifted with respect to each other.

* * * * *